United States Patent [19]

Iijima et al.

[11] Patent Number: 4,847,879
[45] Date of Patent: Jul. 11, 1989

[54] FREQUENCY SENSING AND CONTROL CIRCUIT

[75] Inventors: Kenzaburou Iijima; Yoshinori Hayashi, both of Shizuoka; Makoto Suzuki; Atsushi Uchiyama, both of Iwata, all of Japan

[73] Assignee: Yamaha Corporation, Japan

[21] Appl. No.: 162,879

[22] Filed: Mar. 2, 1988

[30] Foreign Application Priority Data

Mar. 3, 1987 [JP] Japan .................. 62-48332

[51] Int. Cl.$^4$ .................. G01R 25/08; H03L 7/18
[52] U.S. Cl. .................. 377/43; 377/45; 377/26; 328/133
[58] Field of Search .................. 377/39, 43, 45, 26

[56] References Cited

U.S. PATENT DOCUMENTS 3,989,931 11/1976 Phillips .................. 377/43
4,247,898 1/1981 Bosselaers .................. 377/43
4,583,856 4/1986 Moore .................. 377/43 X
4,700,367 10/1987 Kawazoe et al. .................. 377/39
4,763,342 8/1988 Ambrosio et al. .................. 377/43

Primary Examiner—John S. Heyman
Attorney, Agent, or Firm—Ostrolenk, Faber, Gerb & Soffen

[57] ABSTRACT

In construction of a digital phase locked loop for detection of the angular displacement of a mobile object depending on input signals from an encoder, is provided a bit number control circuit so that working bit numbers of A/D converters and a counter in the loop are automatically reduced as the frequency of the input signals rise and, in accordance with such reduction in working bit number, a function generating ROM of a smaller bit number is selected from a group of function generating ROMs of different bit numbers for supply of address data to multipliers connected to the A/D converters, thereby the signal processing speed of the loop is significantly raised to face up to current speed-up in the mobile object displacement.

4 Claims, 3 Drawing Sheets

FREQUENCY SENSING AND CONTROL CIRCUIT

BACKGROUND OF THE INVENTION

The present invention relates to an improved digital phase locked loop, and more particularly relates to an improvement in function of a digital phase locked loop well suited for use in high speed circuits.

A wide variety of circuits have been developed to detect the displacement of a mobile object through demodulation of output signals from a detection encoder.

In one typical example of such detection circuits, is included a digital phase locked loop in which analog signals $\sin\theta$ and $\cos\theta$ corresponding to the displacement of a mobile object are issued by an encoder and digitalized for detection of the phase of the mobile object. More specifically, an encoder issues analog signals $\sin\theta$ and $\cos\theta$ corresponding to the angular displacement of a mobile object and these analog signals $\sin\theta$ and $\cos\theta$ are then digitalized by respective A/D converters. A function generating ROM is separately provided to issue signals $\sin\theta$ and $\cos\theta$ on the basis of its address data given by a counter of n-bits. These signals $\sin\phi$ and $\cos\phi$ are multiplied with the digitalized signals $\sin\theta$ and $\cos\theta$ by respective multipliers. The products of multiplication are then compared with each other by a comparator for calculation of a value $\sin(\theta-\phi)$. When the value $\sin(\theta-\phi)$ is positive, a signal $\overline{U}/D$ at "0" level is issued. Whereas a signal $\overline{U}/D$ at "1" level is issued when the value $\sin(\theta-\phi)$ is negative. The signal $\overline{U}/D$ is then passed to the above-described counter which also receives a series of prescribed clock pulses. On receipt of the signal $\overline{U}/D$ at "0" level, the counter operates in an up-count mode. Whereas the counter operates in a down-count mode on receipt of the signal $\overline{U}/D$ at "1" level. Output signals from the counter are properly latched at rises of the signal $\overline{U}/D$.

In the case of such a detection circuit, the digital phase locked loop operates so that the value $\sin(\theta-\phi)$ should always be equal to 0, i.e. $\theta$ should always be equal to $\phi$. In other words, the output signal from the counter corresponds to the angular displacement $\theta$ of the mobile object. Even when the signal vacillates between "0" and "1" levels as the value $\sin(\theta-\phi)$ approaches 0, presence of a latch removes fluctuation in output. Such a detection circuit is proposed in Japanese Patent Application 61-54288.

It is assumed that a counter of 8-bits and clock pulses of 2 MHz are used in the above-described detection circuit, the maximum frequency that the loop can process is equal to 2 MHz/256=7.8 KHz. In the case of high speed mobile objects, the frequencies of their input signals often exceeds 7.8 KHz and the loop is unable to process such input signals. So, high speed signal processing by digital phase locked loops has been strongly demanded in the market. In connection with this, limitation in the access speed of the function generating ROM and in the processing speed of the comparator forms a neck to use clock pulses of higher frequencies. Further, a time must be reserved for operations of the A/D converters. For these reasons, higher speed signal processing of digital phase locked loops cannot be expected despite the strong demand in the market.

SUMMARY OF THE INVENTION

It is the object of the present invention to significantly raise the signal processing speed of a digital phase locked loop.

In accordance with the basic aspect of the present invention, a digital phase locked loop includes a group of function generating ROMs of different bit numbers and a bit number control circuit which, on the basis of detection of the frequency of input signals to the loop, reduces working bit numbers of major elements in the loop as the frequency rises and, in accordance with such reduction in working bit number, selects a function generating ROM of a smaller bit number from the group.

In a preferred embodiment of the present invention, the digital phase locked loop further includes a clock pulse control circuit which issues system clock pulses at a higher speed as the frequency rises.

DESCRIPTION OF THE PREFERRED EMBODIMENTS

Figure 1:
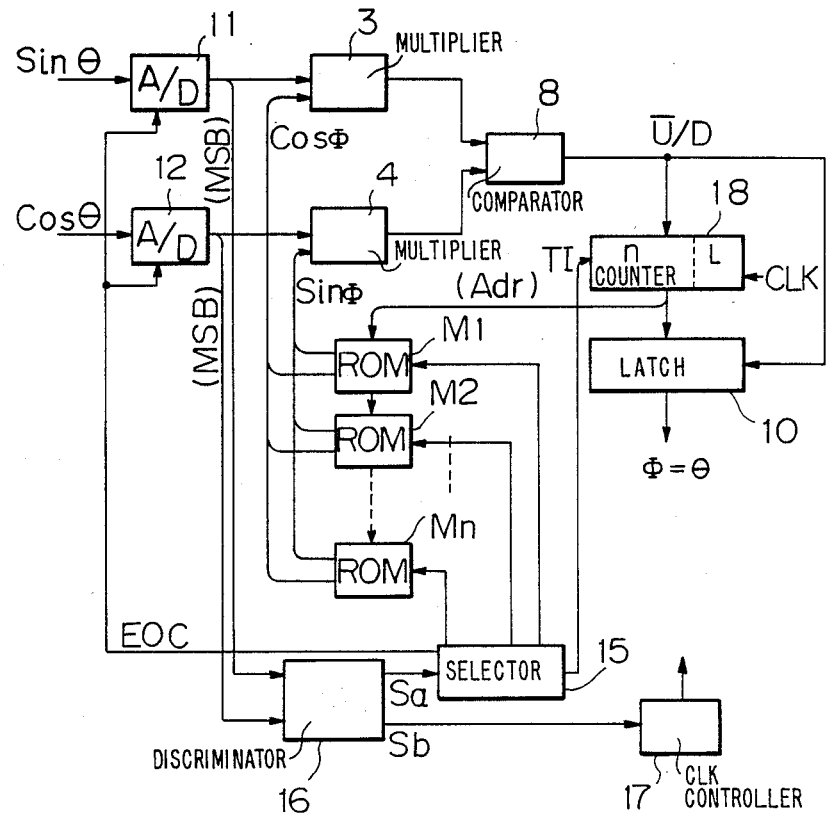
FIG. 1 is a block diagram of one embodiment of the digital phase locked loop in accordance with the present invention.

In FIG. 1, A/D converters 11 and 12 are connected to an encoder (not shown) for receipt of analog signals $\sin\theta$ and $\cos\theta$ to be digitalized therein. The A/D converters 11 and 12 are also connected to a selector 15 which issues an EOC (End of conversion) control signal in order to terminate the operations of the converters 11 and 12. The output signals of the converters 11 and 12 are passed to respective multipliers 3 and 4. Concurrently, the highest bit signals of the output signals from the converters 11 and 12 are passed to frequency discrimination circuit 16. This frequency discrimination circuit 16 detects the frequencies of the input signals on the basis of changes in the above-described highest bit signals and, in accordance with the detected frequencies, passes control signals Sa and Sb to the selector 15 and a clock controller 17 which issues system clock pulses to be passed to various elements in the circuit. The clock controller 17 is controlled by the frequency discrimination circuit 16 to speed up its system clock pulses as its input signal frequencies rise.

Function generating ROMs M1~Mn are connected to the multipliers 3 and 4, each issuing signals $\sin\theta$ and $\cos\theta$ on receipt of address data Adr from a counter 18 connected to the selector 15. In the order of M1 to Mn, the output data bit and the address bus of the function generating ROMs M1~Mn decrease in number. The address buses of the function generating ROMs M1~Mn are connected in common to each other in sequence from the higher side. One of the function generating ROMs M1~Mn is sorted out by the selector 15 connected thereto. In this operation, the selector 15 issues the EOC control signal at a higher speed in accordance with the control signal Sa as the input signal frequency rises, thereby reducing the conversion bit numbers of the A/D converters 11 and 12. In correspondence with this operation, a function generating ROM of a smaller output bit number is sorted out by the selector 15.

The counter 18 counts a series of given clock pulses CLK and includes n lower bits and L higher bits. A signal T1 from the selector 15 is put in one of the n lower bits. Selection of the bit receptive of the signal T1 is performed by the selector 15. With rise in the input signal frequency, a higher bit is selected for receipt of the signal T1. A comparator 8 is interposed between the multipliers 3, 4 and the counter 18. Further, a latch 10 is connected to the output sides of the comparator 8 and the counter 18.

The digital phase locked loop of the above-described construction operates as follows. As the frequencies of the analog signals $\sin\theta$ and $\cos\theta$ rise, the frequency discrimination circuit 16 detects the rises and, as a consequence, issues control signals Sa and Sb corresponding to the detected frequencies. As a result, the selector 15 operates to reduce conversion bit number of the A/D converters 11 and 12.

One of the function generating ROMs M1~Mn corresponding to the conversion bit number of the A/D converters 11 and 12 is sorted out to reduce operation bit number at the multipliers 3 and 4 end to shorten the multiplication time.

At the counter 18, the signal T1 from the selector 15 is put in a bit corresponding to the conversion bit number of the A/D converters 11 and 12 and counting of the clock pulses CLK is started from the position of the bit. As a consequence, its count output changes quite swiftly. When the signal T1 is put in a kth bit from the lowest side, its operation speed is $2^{(k-1)}$ times higher than the operation speed needed when the n lower bits are all used for the counting. The count outputs of the counter 18 are passed, as the address data Adr, to the selected one of the function generating ROMs M1~Mn. In this way, a digital phase locked loop of a reduced bit number is formed by the multipliers 3, 4, the comparator 8, the counter 18 and the function generating ROMs M1~Mn. As a consequence, the operation speed of the loop is raised $2^{(k-1)}$ times from that needed when the n lower bits are all use for counting.

In this case, the frequencies of the system clock pulses to be issued by the clock controller can be raised too. This rise in frequency also promotes speed-up of the digital phase locked loop in accordance with the present invention. Upper limits, however, are set to the frequencies of the system clock pulses in correspondence to the reading speed at the function generating ROMs M1~Mn.

As is clear from the foregoing description, the conversion bit number of the A/D converters 11, 12 and the bit number of the digital phase locked loop are reduced for high frequencies of input signals, thereby significantly raising the operation speed, i.e. signal processing speed, of the system. Reduction in bit number poses no ill influence on precision in detection inasmuch as no high degree of dissolution is required in the case of a high speed mobile object.

The working bit numbers of the digital phase locked loop end of the A/D converters should be set to values to cause no runaway of the loop and to enable reliable A/D conversion.

Figure 2A:
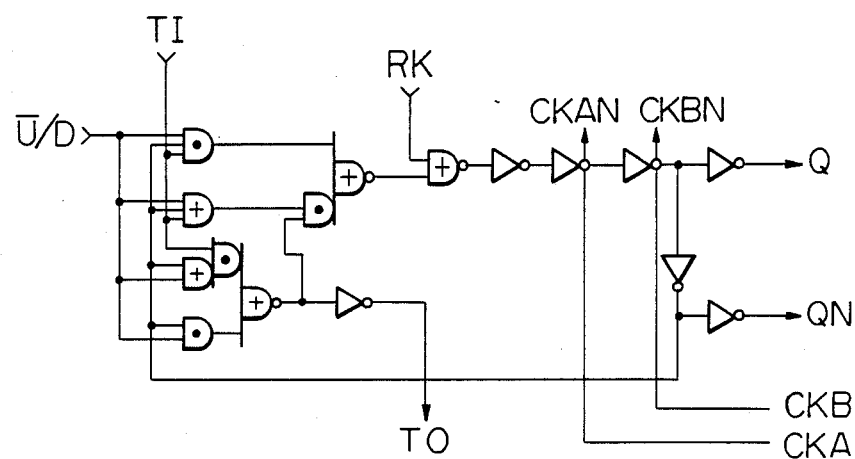
FIGS. 2A and 2B are block diagrams of a counter used for the loop shown in FIG. 1.
Figure 2A:
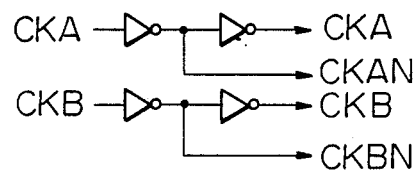
Figure 2B:
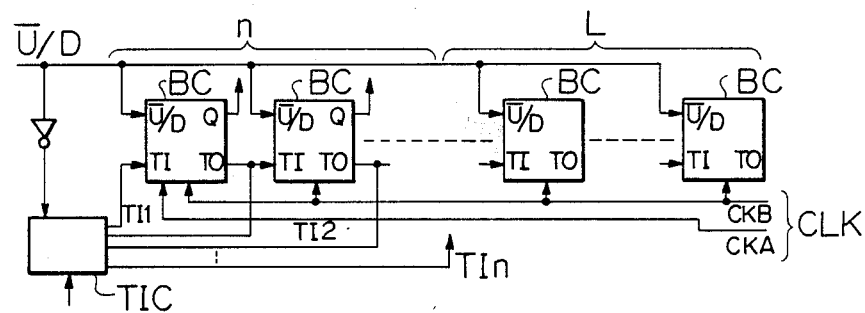

One example of the counter 18 is shown in FIGS. 2A and 2B, in which a trigger control circuit TIC included in the selector 15 fixes a bit to pass a trigger to the counter 18.

As shown in FIG. 2B, the counter 18 includes (n+L) sets of bit cells BC connected in a cascade connection and each bit BC is made up of logic gates such as shown in FIG. 2A.

The bit cell BC is given in the form of a synchronous up-down counter which performs a two phase clock dynamic operation. More specifically, the bit cell BC operates as follows.

(1) When a "0" signal is supplied to its terminal $\overline{U}/D$, the bit cell BC operates in the up-count mode. When its trigger input terminal T1 is held at "1" level in this mode, its output terminal Q is inverted at rise of clock pulses CKB. Its trigger output terminal T0 is held at "1" level, only when the output terminal Q and the trigger input terminal T1 are both held at "1" level. Otherwise, the trigger output terminal T0 is held at "0" level.

When the trigger input terminal T1 is held at "0" level in the up-count mode, the output terminal Q remains unchanged even when the clock pulse changes. In other words, its counting operation is inhabited.

(2) When a "1" signal is supplied to its terminal $\overline{U}/D$, the bit cell BC operates in the down-mode. When its trigger input terminal T1 is held at "0" level in this mode, its output terminal Q is inverted at rise of the clock pulses CKB. Its trigger output terminal T0 is held at "0" level, only when the output terminal Q and the trigger input terminal T1 are both held at "0" level. Otherwise, the trigger output terminal T0 is held at "1" level.

When the trigger input terminal T1 is held at "1" level in the down-count mode, the output terminal remains unchanged even when the clock pulse changes. In other words, its counting operation is inhabited.

(3) The bit cell BC is reset when a "1" signal is supplied to its terminal RK. On supply of a "1" signal to the terminal RK, the output terminal Q is held at "0" level at rise of the clock pulses CKB regardless of the states of other signals processed. Thus, the bit cells BC are concurrently reset in synchronism despite their cascade connection.

Figure 3:
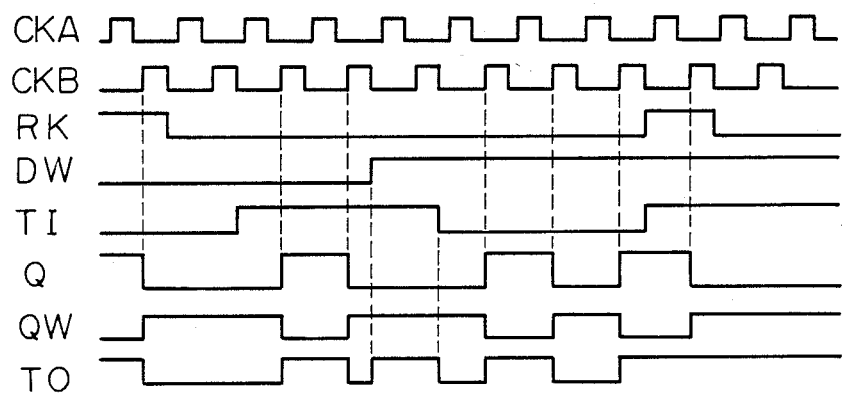
FIG. 3 is a timing chart for the counter shown in FIGS. 2A and 2B.

By the cascade connection of the bit cells BC, the couner is formed to include any selected number of bits. Operation of the bit cell BC is shown in FIG. 3. In the case of the construction shown in FIGS. 2A and 2B, the clock pulses CKA are not used.

In the construction shown in FIG. 2B, signals TI1~TIn set the first bit for the counting operation. Assuming that a signal TIk is supplied to the trigger input terminal TI of a bit cell BC acting as the first bit, the trigger control circuit TIC sets the signal TIk to "1" level, other signals to a high impedance condition and the signal $\overline{U}/D$ to "0" level. As a consequence, an up-counter of (n+L−k) bits is formed. The above-described signal TIk is formed by inversion of the signal $\overline{U}/D$ by an inverter shown in FIG. 2B.

When the trigger control circuit TIC sets the signal TIk to "0" level, other signals to a high impedance condition and the signal $\overline{U}/D$ to "1" level, a down-counter of (n+L−k) bits is formed.

In this case, the higher L bits of the counter 18 receive no triggers from the trigger control circuit TIC and stay out of the digital phase locked loop, these L bits can be synchronized with the lower n bits through common use of the up-down switch terminals $\overline{U}/D$. Thus, the construction of the counter can be simplified greatly.

I claim:

1. An improved frequency sensing and control circuit, comprising
   a pair of analog to digital (A/D) converters connected to an encoder for receipt of input signals corresponding to a displacement of a mobile object, each being changeable in its working bit number,
   a pair of multipliers, each being connected to each said A/D converter,
   a comparator connected to said multipliers and issuing an up-down switch signal in accordance with the result of comparison of output signals from said multipliers,
   a counter connected to said comparator for receipt of said up-down switch signal and to a supply source of system clock pulses, and being changeable in its working bit number,
   a plurality of function generating read only memories (ROMs) of different bit numbers, each being connected to said multipliers, and
   a bit number control circuit connected to said A/D converters, said function generating ROMs and said counter,
   said bit number control circuit detecting the frequency of said input signals from said encoder and, on the basis of the result of detection, issuing an end of conversion control (EOC) signal which is passed to said A/D converters to reduce said working bit number of said A/D converters as said frequency rises,
   said bit number control circuit selecting, on the basis of the result of said detection, one of said function generating ROMs in accordance with said working bit number of said A/D converters fixed by said EOC signal, and
   said bit number control circuit further issuing, on the basis of the result of said detection, a T1 signal which is assigned to said counter and put in a higher bit as said frequency rises in order to fix the starting bit of its counting operation.

2. An improved digital phase locked loop as claimed in claim 1 in which
   said bit number control circuit includes a frequency discrimination circuit connected to said A/D converters and a selector connected to said frequency discrimination circuit.

3. An improved digital phase locked circuit as claimed in claim 1 further comprising
   a clock pulse control circuit connected to said A/D converters and generative of system clock pulses at a higher speed as said frequency rises.

4. An improved digital phase locked loop as claimed in claim 3 in which
   said clock pulse control circuit includes a frequency discrimination circuit connected to said A/D converters and a clock pulse controller connected to said frequency discrimination circuit.

* * * * *